(12) United States Patent
Lange et al.

(10) Patent No.: US 8,093,097 B2
(45) Date of Patent: Jan. 10, 2012

(54) LAYER SEQUENCE AND METHOD OF MANUFACTURING A LAYER SEQUENCE

(75) Inventors: Thomas Lange, Bad Bramstedt (DE); Joerg Syre, Barmstedt (DE); Michael Rother, Uetersen (DE); Torsten Krell, Pinneberg (DE)

(73) Assignee: NXP B.V., Eindhoven (NL)

( * ) Notice: Subject to any disclaimer, the term of this patent is extended or adjusted under 35 U.S.C. 154(b) by 16 days.

(21) Appl. No.: 11/917,092

(22) PCT Filed: Jun. 12, 2006

(86) PCT No.: PCT/IB2006/051852
§ 371 (c)(1),
(2), (4) Date: Dec. 10, 2007

(87) PCT Pub. No.: WO2006/134534
PCT Pub. Date: Dec. 21, 2006

(65) Prior Publication Data
US 2008/0206588 A1 Aug. 28, 2008

(30) Foreign Application Priority Data
Jun. 15, 2005 (EP) .................................... 05105237

(51) Int. Cl.
H01L 21/00 (2006.01)

(52) U.S. Cl. .................. 438/98; 257/E21.523; 257/734
(58) Field of Classification Search .................. 257/734, 257/E21.523; 438/98
See application file for complete search history.

(56) References Cited

U.S. PATENT DOCUMENTS

| 5,508,228 A | 4/1996 | Nolan et al. | |
|---|---|---|---|
| 6,602,775 B1 | 8/2003 | Chen et al. | |
| 6,841,872 B1 * | 1/2005 | Ha et al. | 257/736 |
| 2002/0017553 A1 * | 2/2002 | Jao | 228/215 |
| 2002/0110954 A1 * | 8/2002 | Maeda et al. | 438/106 |
| 2003/0073300 A1 * | 4/2003 | Chen et al. | 438/613 |
| 2003/0107137 A1 | 6/2003 | Stierman et al. | |
| 2003/0129541 A1 * | 7/2003 | Weng | 430/311 |
| 2005/0012211 A1 * | 1/2005 | Kung et al. | 257/734 |
| 2005/0029677 A1 | 2/2005 | Huang | |
| 2007/0069346 A1 * | 3/2007 | Lin et al. | 257/673 |

FOREIGN PATENT DOCUMENTS

| EP | 1333494 A2 | 8/2003 |
|---|---|---|
| JP | 2000058577 A | 2/2000 |

* cited by examiner

Primary Examiner — Thao Le
Assistant Examiner — Matthew Gordon

(57) ABSTRACT

A layer sequence (400), comprising an aluminum layer (300), a nickel layer (301), and a nickel layer protection layer (302; 701). The aluminum layer (300) is formable on a substrate (200), the nickel layer (301) is formed on the aluminum layer (300), and the nickel layer protection layer (302; 701) is formed on the nickel layer (301).

5 Claims, 3 Drawing Sheets

LAYER SEQUENCE AND METHOD OF MANUFACTURING A LAYER SEQUENCE

The invention relates to a layer sequence.

The invention further relates to the use of a layer sequence as an under bump metallisation.

The invention further relates to a method of manufacturing a layer sequence.

For semiconductor industry, the manufacturing of integrated circuit comprises different stages, namely fabrication of wafers, fabrication of integrated circuits, and connecting the integrated circuits to the environment, for instance by soldering the integrated circuits to a PCB (printed circuit board).

US2005/0012211A1 discloses an under bump metallurgic structure between the bonding of a die or a substrate and a solder bump, comprising an adhesion layer, a barrier layer, and a wettable layer.

US 2005/0029677A1 discloses an under bump metallurgic (UBM) layer comprising a first metal layer, a liner layer, a second metal layer, and a third metal layer. Furthermore, a passivation layer may be formed on a surface of a chip.

However, the under bump metallization (UBM) according to US 2005/0029677A1 is complex, and thus time-consuming and expensive in manufacture.

It is an object of the invention to provide a simple under bump metallisation.

In order to achieve the object defined above, a layer sequence, the use of a layer sequence as an under bump metallisation, and a method of manufacturing a layer sequence according to the independent claims are provided.

According to an exemplary embodiment of the invention, a layer sequence is provided comprising an aluminium layer, a nickel layer, and a nickel layer protection layer. The aluminium layer is formed or formable on a substrate, the nickel layer may be formed on the aluminium layer, and the nickel layer protection layer may be formed on the nickel layer.

According to another exemplary embodiment of the invention, the use of a layer sequence having the above-mentioned features as an under bump metallisation is provided.

Moreover, according to still another exemplary embodiment of the invention, a method of manufacturing a layer sequence is provided, wherein the method comprises the steps of forming an aluminium layer on a substrate, forming a nickel layer on the aluminium layer, and forming a nickel layer protection layer on the nickel layer.

The characterizing features according to the invention particularly have the advantage that a layer sequence of an aluminium layer, a nickel layer and a nickel layer protection layer can be provided in the described order on a semiconductor substrate to form an under bump metallization (UBM) with low effort and high quality. The manufacture of such a structure is easy and can be carried out with standard equipment so that it is dispensable to develop new equipment or procedures.

Particularly, an AlNiTi structure or an AlNiAg structure may be provided particularly for use as an under bump metallization, wherein the aluminum/nickel portion forms an intermetallic phase, and the titanium layer or the silver layer may serve as a protection layer.

A titanium layer may serve as an oxidation barrier preventing the nickel layer from being undesirably oxidized during the manufacturing process of the layer sequence. This may include a protection against chemical and physical influences. A silver layer may also serve as an oxidation barrier and/or as a protection against chemical or mechanical damage of the underlying nickel layer. In addition, silver material is suitable for a soldering process, so that a silver layer as a nickel layer protection layer does not need to be removed before forming a solder bump on the top of the layer sequence. In contrast to this, the silver material may form a part of the solder structure. However, when titanium is implemented as a nickel layer protection layer, the titanium material may be removed before forming the solder structure on the uncovered nickel structure.

To reduce the production costs of a CSP (Chip Scale Packaging) device, it is possible, according to an exemplary embodiment of the invention, to substitute a conventional under bump metallization by the deposition of AlNiTi or AlNiAg as an interconnection metal structure having an oxidation barrier on a wafer. The term "Chip Scale Packaging" may particularly denote a single-die, direct surface mountable package.

After the metal deposition, it is possible to characterize the chips on the wafer level. By using AlNiTi, no additional metal layer from backend source is needed and may thus be dispensable.

Instead of a second metal module, the interconnection layer according to an exemplary embodiment of the invention may be created during the "IC process", that is to say during the process of forming an integrated circuit in a semiconductor substrate.

The standard metal (e.g. aluminum) may be replaced by a stack of Al/Ni/Ti, wherein the titanium layer may be used as an oxidation protection only. Or, the standard metal (e.g. aluminum) may be replaced by a stack of Al/Ni/Ag, wherein the silver layer may be used as an oxidation protection and/or as a part of a solder structure to be formed. The intermetallic area may be generated from the nickel layer together with the material from the spheres.

As a result, on the semiconductor surface, only a stack of Al/Ni may remain, whereas the titanium layer and an optional passivation layer (which may be manufactured from silicon nitride, $Si_3N_4$) may be structured and a solder, for instance essentially shaped as a sphere, may be brought in direct contact with the stack of Al/Ni.

Or, a stack of Al/Ni/Ag may remain, whereas the silver layer may form part of a solder, for instance essentially shaped as a sphere. In other words, silver material may be solvable during a solder process.

Alternatively, the metal stack can be deposited after deposition of the passivation structure. So, the process can be used as a "drop in" for a standard UBM metallization (Al/NiV/Cu).

According to one aspect of the invention, the UBM module may be integrated into the diffusion process. By this, the whole process module can be skipped which may significantly simplify the manufacturing procedure. Besides this, the process can be integrated into in-house production flow. Thus, the teaching according to the invention may reduce the total costs for the integrated circuit product.

One exemplary field of application of the invention are dies which can be soldered to a PCB (Printed Circuit Board) or can be used for flipchip packaging.

The layer sequence according to one exemplary embodiment of the invention comprises the aluminum layer which may be denoted as an adhesion layer, since it may support adherence of the layer sequence with a semiconductor chip. Then, a barrier layer like nickel can be used, wherein solder may be directly coupled to this nickel layer. Furthermore, a nickel layer protection layer may be an issue, which may be realized by titanium or silver.

It may be advantageous that the single layers of the layer sequence are sufficiently thick in order to prevent electrical migration along the transmission line.

According to an exemplary embodiment of the invention, an aluminum layer is first formed on a semiconductor substrate, like a silicon wafer or chip. Then, a layer of nickel may be deposited on the aluminum layer, and subsequently a layer of titanium may be deposited on the nickel layer. Furthermore, a passivation layer may be deposited on the structure obtained, wherein such a passivation layer may be made of silicon nitride. In this context, the titanium layer may serve as a protection layer to protect the layers of aluminum and nickel during the manufacture of the passivation layer.

For manufacturing the contact areas for the soldering of the connections of the semiconductor components, the layer sequence of titanium and silicon nitride may be patterned subsequently or simultaneously. In other words, an etching step may be performed in the region of the contact areas to be manufactured, wherein the nickel layer may serve as a stop layer for the etching procedure. Subsequently, solder may applied to the nickel layer, for instance with tin solder.

Summarizing, the sequence of an aluminum layer, a nickel layer and a titanium layer is an advantageous material combination from the chemical and physical point of view, and may provide a stable, conductive and properly adhering UBM to provide a high-quality bridging structure between a substrate and a solder bump.

Particularly, the nickel layer protection layer may be made of an oxidation inhibiting material like titanium or silver which may efficiently protect the underlying layer(s), particularly nickel, from being oxidized during the manufacturing process (which may involve the presence of aggressive chemicals, photolithographic steps, substrate grinding steps, etc.).

According to one aspect of the invention, NiAg is used as an under bump metallization (UBM) which can be placed on diffused wafers. To create the opportunity of bumping wafers coming from different diffusion sources, an UBM stack is provided which can be placed on standard diffusion metallization, like aluminum. The metallization has a proper adhesion to the aluminum layer and has a solderable behaviour.

The UBM module according to this exemplary embodiment can be used as a proper alternative to existing layers and may thus increase flexibility. Furthermore, this process reduces the total costs for the products due to the fact that the whole bumping process can be done within one company. It includes the opportunity to bump products from different diffusion centres.

In the frame of such a process, a NiAg stack may be deposited on a diffused wafer with aluminum metallization on pads. The NiAg may be used to generate an intermetallic structure between the diffusion metal and a solder sphere. The layers may be sputtered. Subsequently, a photo lithography step may be performed to define a solderable area.

In the following, further exemplary embodiments of the invention will be described.

Next, exemplary embodiments of the layer sequence will be described. However, these embodiments also apply for the use of such a layer sequence as under bump metallization, and for the method of manufacturing a layer sequence.

The substrate on which the triple layer of aluminum, nickel and nickel layer protection layer (e.g. titanium or silver) may be formed may be a semiconductor substrate like a silicon substrate or a germanium substrate. However, the invention is not restricted to group-IV semiconductors, but may also be applied in the frame of a group-III-V semiconductor, like gallium arsenide. Such a substrate may be a wafer or a chip, wherein an integrated circuit may be formed in and/or on the substrate. On a surface of the substrate, one or more bonding pads may be formed which may be made of an electrically conductive material coupled to integrated circuit components, like transistors (e.g. MOSFETs), memory cells, logic circuits, diodes, capacitors, etc.

The nickel layer protection layer, particularly realized as a titanium layer, may be patterned so that the nickel layer may be uncovered. In other words, a lithography and etching process may be carried out to pattern the nickel layer protection layer. In this context, the nickel layer may function as a stop layer during the etching process.

Furthermore, the layer sequence may comprise a passivation layer which may be formed on the nickel layer protection layer or which may be formed on the substrate or which may be formed on the aluminum layer. Such a passivation layer, which may be a silicon nitride layer, may protect the entire structure. Alternatively, the passivation layer may be made of silicon oxide, PSG (Phosphor-Silicate Glass), etc.

Such a passivation layer may be directly applied to the substrate, wherein the sequence of aluminum, nickel and nickel layer protection may then be deposited afterwards, particularly after having patterned the passivation layer. Alternatively, the passivation layer may be applied after having deposited the layer sequence of aluminum, nickel and nickel layer protection layer. Further alternatively, the passivation layer may be applied after having deposited the aluminum layer, and before depositing the nickel layer and the nickel layer protection layer.

Furthermore, the passivation layer may also be patterned so that at least a part of the surface of the entire structure is formed by nickel material. By taking this measure, solder material can be applied directly to the nickel layer so obtain a stable bonding.

For instance, the solder structure may be a tin structure. The material combination of tin and nickel form a stable and chemically appropriate connection. More particularly, the material of the solder structure may be, for instance, SnAg, SnAgBi, SnAgBiCu, SnAgBiCuGe, SnAgCu, SnBi, SnCu, SnZn, SnCuSbAg, SnSb, SnZnBi, SnPbAg, or SnPb.

Furthermore, an integrated circuit may be formed in the substrate, wherein the aluminum layer may be electrically coupled to the integrated circuit. Thus, the layer sequence may form a bridge between integrated circuit components like memory cells, transistors, conductive wiring, capacitors, or the like on the one hand and the solder bump on the other hand.

In the following, further exemplary embodiments of the method of manufacturing a layer sequence will be described. However, these embodiments also apply for the layer sequence and for the use of the layer sequence as an under bump metallization.

The method may comprise a step of forming a passivation layer on the nickel layer protection layer or on the aluminum layer.

Further, the method may comprise the step of patterning the passivation layer and/or the nickel layer protection layer so as to uncover the nickel layer.

Such a patterning step may be performed simultaneously for the two layers to be patterned, that is to say particularly the passivation layer and the titanium layer may be patterned in a common method step. The nickel layer may serve as a stop layer for this etching procedure. This may allow for a simple manufacture of the layer sequence.

The method may further comprise the step of forming a solder structure on the nickel layer and/or on the nickel layer protection layer, the solder structure for instance having an essentially spherical shape.

Conventionally, a front-end process in semiconductor technology comprises forming an integrated circuit in a chip and forming a metallization. A back-end process may comprise forming a UBM and packaging. According to an aspect of the invention, the forming of the UBM may be shifted to the front-end process. This may allow to omit one metal in the back-end process.

The aspects defined above and further aspects of the invention are apparent from the examples of embodiment to be described hereinafter and are explained with reference to these examples of embodiment.

The invention will be described in more detail hereinafter with reference to examples of embodiment but to which the invention is not limited.

The illustration in the drawing is schematically. In different drawings, similar or identical elements are provided with the same reference signs.

Figure 1:
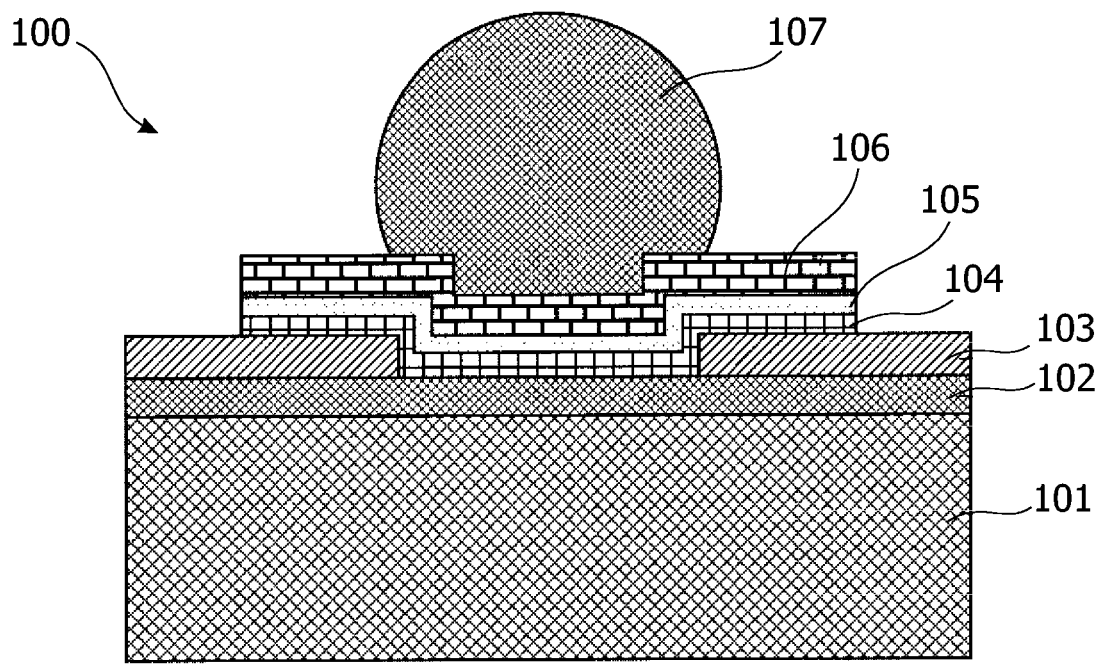
FIG. 1 shows a layer sequence.

In the following, referring to FIG. 1, a layer sequence 100 will be described.

The layer sequence 100 comprises a semiconductor chip device 101 having applied thereon an interconnection metal layer 102. A passivation layer 103 is deposited on the interconnection metal layer 102 and is patterned. Furthermore, an aluminum layer 104 is deposited on the interconnection metal layer 102 and on the passivation layer 103. Further, a nickel/vanadium layer 105 is deposited on the aluminum layer 104. Moreover, a copper layer 106 is formed on the nickel/vanadium layer 105. Then, a solder sphere 107 is applied on the copper layer 106, either having a lead content or being lead-free.

Referring to FIG. 1, an UBM (under bump metallization) is used as an interconnection layer for preformed solder spheres. The metallization stack is created from Al/NiV/Cu (layers 104 to 106), wherein the aluminum layer 104 is used as the contact material to the pad surface, and the copper layer 106 creates the intermetallic structure.

The aluminum layer 104 may have a thickness of approximately 400 nm, the NiV layer 105 may have a thickness of approximately 400 nm, and the copper layer 106 may have a thickness of 800 nm.

In the following, referring to FIG. 2 to FIG. 5, a method of manufacturing a layer sequence according to an exemplary embodiment of the invention will be described.

Figure 2:
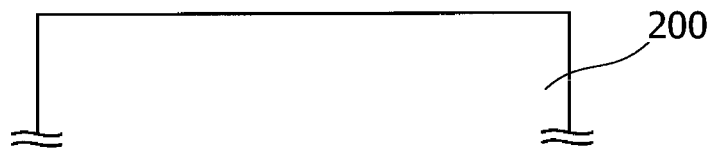
FIG. 2 shows a structure obtained during a method of manufacturing a layer sequence according to an exemplary embodiment of the invention.

FIG. 2 shows a silicon chip 200 in which an integrated circuit (not shown) is formed. Such an integrated circuit may, for instance, comprise a logic circuit and a memory circuit or an integrated discrete circuit. Components of such an integrated circuit may include transistors, capacitors, diodes, inductors, metal connections, etc. The silicon chip 200 is to be connected to the macroscopic environment, in order to allow to transmit signals between the integrated circuit and the environment. For this purpose, bonding pads (not shown) are formed on the surface of the silicon chip 200 which bonding pads are to be contacted electrically to the macroscopic environment, as will be described in the following.

Figure 3:
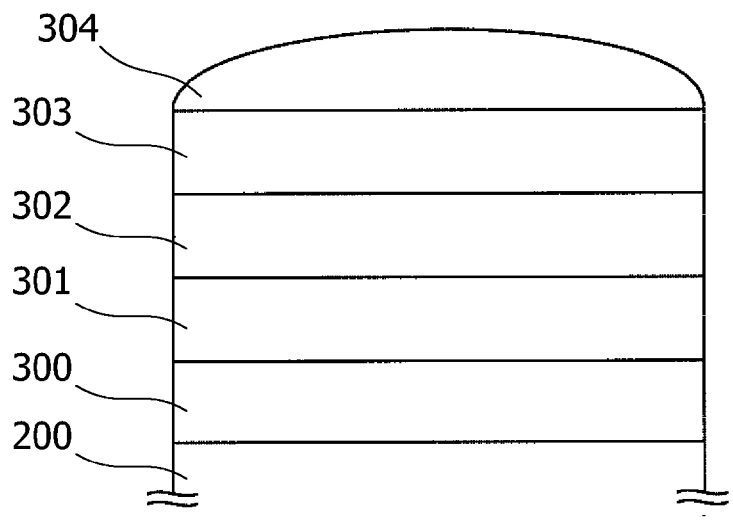
FIG. 3 shows another structure obtained during a method of manufacturing a layer sequence according to an exemplary embodiment of the invention.

In order to produce the structure shown in FIG. 3, an aluminum layer 300 is deposited, for instance by sputtering, on the silicon substrate 200. The aluminum layer 300 may have a thickness of 0.8·mu·m to 1.2·mu·m, preferably 1.0·mu·m.

After that, a nickel layer 301 is deposited on the aluminum layer 300 by sputtering. The nickel layer 301 may have a thickness of 0.5·mu·m to 1.0·mu·m, preferably 0.8·mu·m.

Subsequently, a titanium layer 302 is deposited on the nickel layer 301 by sputtering. The titanium layer 302 may have a thickness of 0.1·mu·m to 0.2·mu·m, preferably 0.12·mu·m.

After this, the metallization layers 300, 301, 302 may be patterned (not shown in the figures) so that only selected portions of the silicon chip 200 remain covered with metallic material.

Furthermore, a silicon nitride layer 303, serving as a passivation layer, can be deposited on the titanium layer 302, for instance by PECVD (plasma-enhanced chemical vapour deposition).

The aluminum layer 300 may allow a proper contact to silicon material of the silicon chip 200. The nickel layer 301 may provide a barrier and may allow a proper soldering with a conductive bump to be soldered on the top of the layer sequence to be produced. The titanium layer 302 may prevent the nickel layer 301 from undesired oxidation during forming the silicon nitride layer 303.

Then, a photoresist 304 is deposited on the surface of the silicon nitride layer 303. The aluminum layer 300 and the nickel layer 301 form an intermetallic layer, wherein the titanium layer serves as an oxidation barrier for improving the deposition of the silicon nitride layer 303.

Figure 4:
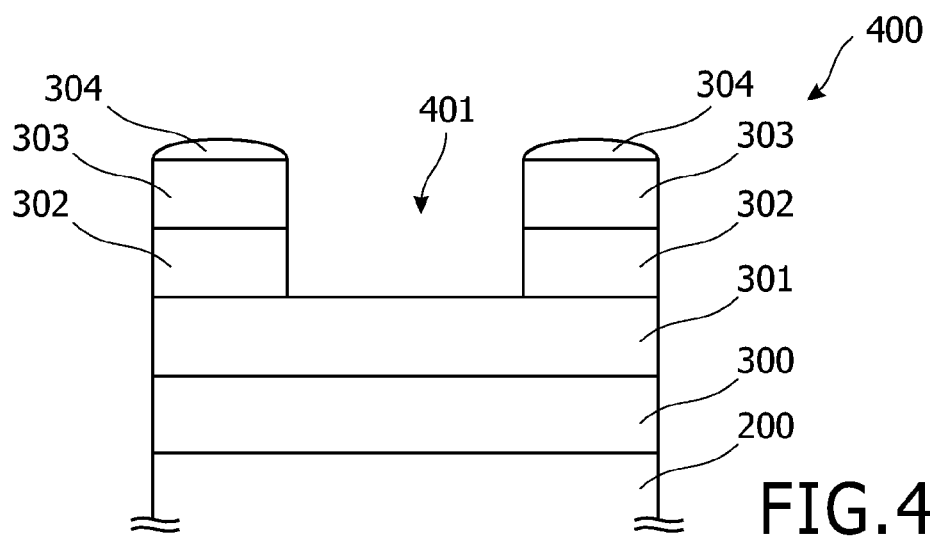
FIG. 4 shows a layer sequence according to an exemplary embodiment of the invention.

In order to obtain the structure shown in FIG. 4, a (photo-) lithography process and an etching process are performed based on the structure shown in FIG. 3. For this purpose, the photoresist 304 is patterned in such a manner that a subsequent etching step removes material of the silicon nitride layer 303 and of the titanium layer 302, whereas material of the nickel layer 301 is not removed by etching. Consequently, a trench 401 is generated so that a surface of the nickel layer 301 is uncovered.

Figure 5:
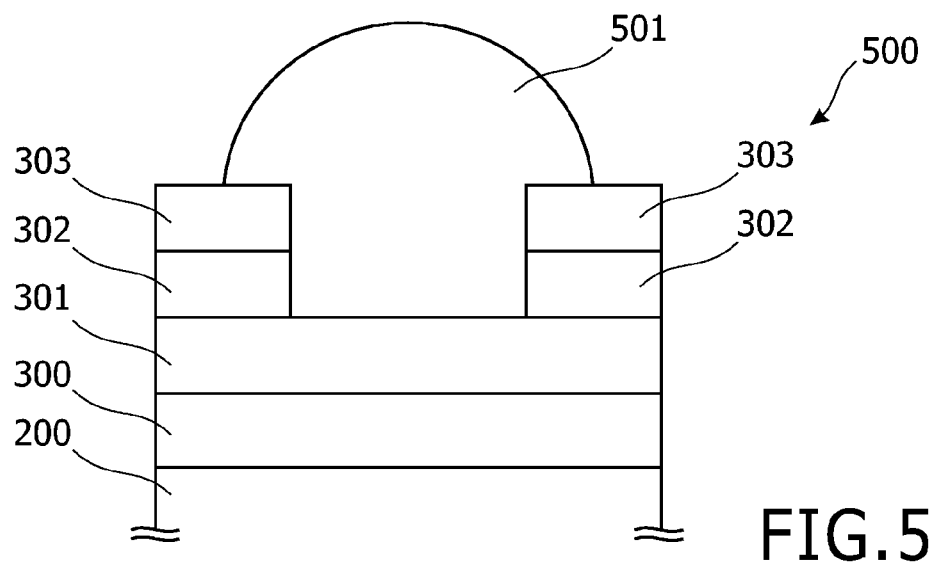
FIG. 5 shows the layer sequence of FIG. 4 having a solder bump provided thereon.

As shown in FIG. 5, a layer sequence 500 according to an exemplary embodiment of the invention can be obtained by forming a solder sphere 501 on the surface of the layer sequence 400, wherein the solder sphere 501 particularly forms a bonding with the nickel layer 301.

Figure 6:
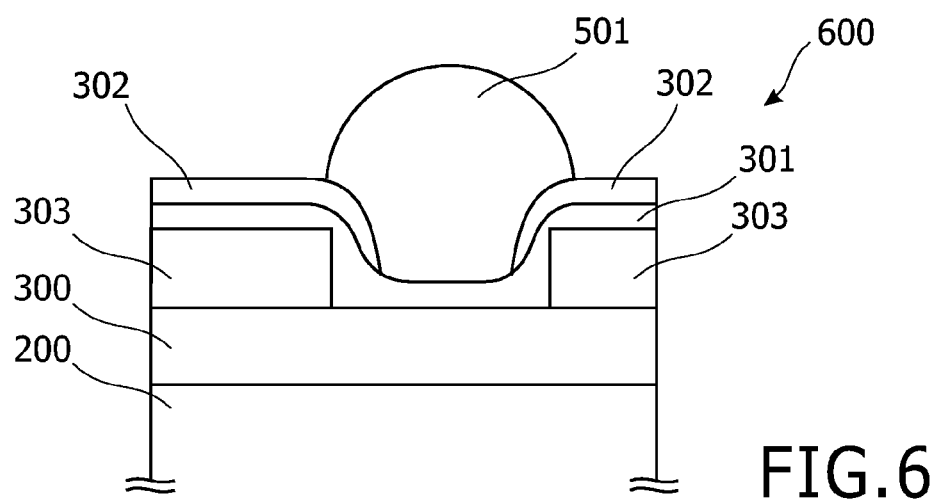
FIG. 6 shows a layer sequence according to another exemplary embodiment of the invention.

In the following, referring to FIG. 6, a layer sequence 600 according to an exemplary embodiment of the invention will be described.

The layer sequence 600 differs from the layer sequence 500 in that the silicon nitride layer 303, that is to say the passivation layer, is directly applied to the patterned aluminum layer 300 deposited on the silicon substrate 200 and serving as a wiring to connect components of the integrated circuit 200. After having patterned the silicon nitride layer 303, the nickel layer 301 and the titanium layer 302 are deposited.

The titanium layer 302 serves as a protection layer for preventing the nickel layer 301 from oxidation and/or chemical damage and/or mechanical damage during the manufacture process. After having finished the manufacture, the titanium layer 302 is patterned using a photoresist or may be removed entirely for uncovering at least a part of the surface of the nickel layer 301 for subsequent deposition of solder material to form some kind of solder sphere 501.

The NiTi stack formed by the nickel layer 301 and the titanium layer 302 deposited on the aluminum layer 300 may be substituted by an AlNiTi stack formed of an aluminum layer (not shown), the nickel layer 301 and the titanium layer 302 deposited on the aluminum layer 300.

Figure 7:
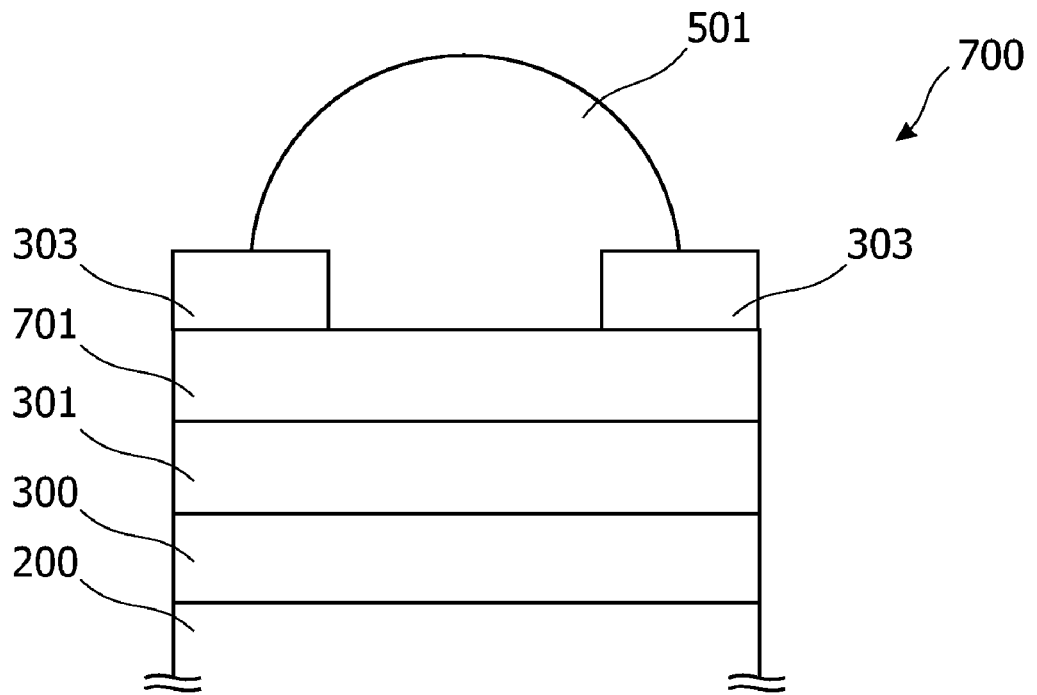
FIG. 7 shows a layer sequence according to another exemplary embodiment of the invention.

In the following, referring to FIG. 7, a layer sequence 700 according to an exemplary embodiment of the invention will be described.

The layer sequence 700 differs from the layer sequence 500 particularly concerning two aspects. Firstly, the nickel layer protection layer in FIG. 7 is realized as a silver layer 701 in contrast to the titanium layer 302. Secondly, the silver layer 701 is not patterned—in contrast to the titanium layer 302 shown in FIG. 5—since the silver material is solderable so that a solder bump 501 may be directly formed on the silver layer 701.

Figure 8:
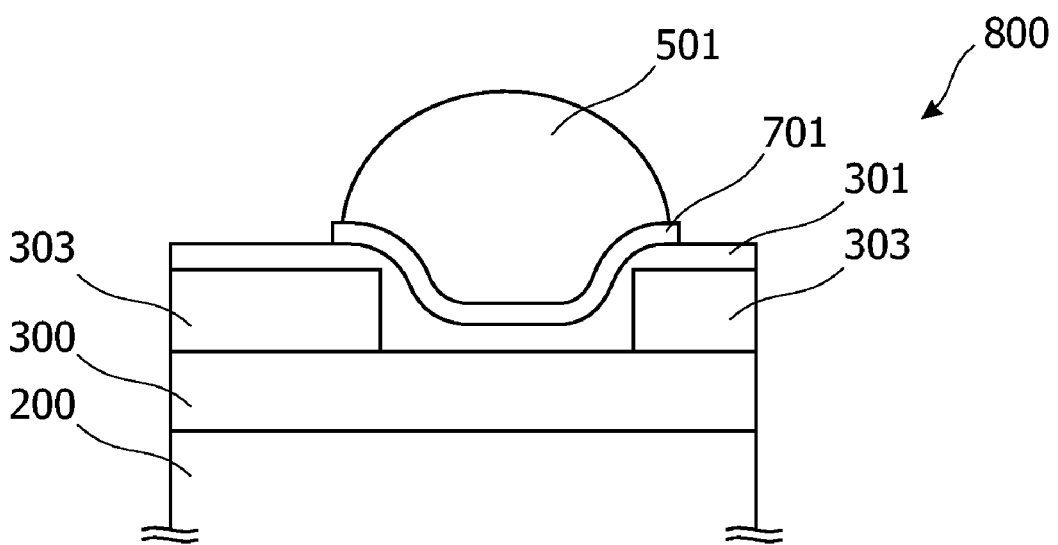
FIG. 8 shows a layer sequence according to another exemplary embodiment of the invention.

In the following, referring to FIG. 8, a layer sequence 800 according to an exemplary embodiment of the invention will be described.

The layer sequence 800 differs from the layer sequence 600 particularly concerning two aspects. Firstly, the nickel layer protection layer in FIG. 8 is realized as a silver layer 701 in contrast to the titanium layer 302. Secondly, the silver layer 701 is not removed from the surface of the nickel layer 301 is a region where the solder bump 501 is formed—in contrast to the titanium layer 302 shown in FIG. 6—since the silver material is solderable so that a solder bump 501 may be directly formed on the silver layer 701.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

LIST OF REFERENCE SIGNS

100 layer sequence
101 chip device
102 interconnection metal
103 passivation layer
104 aluminium layer
105 nickel/vanadium layer
106 copper layer
107 solder sphere
200 silicon chip
300 aluminium layer
301 nickel layer
302 titanium

The invention claimed is:

1. A method of manufacturing a layer sequence of an under bump metallurgic structure, the method comprising:
   forming an aluminum layer on a bonding pad of a substrate, the aluminum layer forming an adhesion layer of the under bump metallurgic structure;
   forming a nickel layer on the aluminum layer, the nickel layer forming a barrier layer of the under bump metallurgic structure, the nickel layer completely covering the aluminum layer;
   forming a nickel layer protection layer on the nickel layer, the nickel layer protection layer preventing the nickel layer from being oxidized during the manufacturing of the layer sequence, the nickel layer protection layer completely covering the nickel layer;
   after the step of forming the nickel layer protection layer, removing parts of the nickel layer protection layer to expose parts of the nickel layer; and
   after the step of removing parts of the nickel layer protection layer, forming a solder material on the exposed parts of the nickel layer, wherein the solder material is brought in direct contact with the exposed parts of the nickel layer.

2. The method of claim 1, wherein the nickel layer protection layer is a titanium layer.

3. The method of claim 1 further including the step of forming a passivation layer on the nickel layer protection layer.

4. The method of claim 1, being integrated in the process of manufacturing an integrated circuit in the substrate.

5. The method of claim 3, wherein the nickel layer protection layer prevents the nickel layer from being oxidized during the manufacture of the passivation layer.

* * * * *